US007076710B2

(12) United States Patent
Knips et al.

(10) Patent No.: US 7,076,710 B2
(45) Date of Patent: Jul. 11, 2006

(54) NON-BINARY ADDRESS GENERATION FOR ABIST

(75) Inventors: Thomas J. Knips, Wappingers Falls, NY (US); Tom Y. Chang, Poughkeepsie, NY (US); James W. Dawson, Poughkeepsie, NY (US); Douglas J. Malone, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 435 days.

(21) Appl. No.: 10/413,613

(22) Filed: Apr. 14, 2003

(65) Prior Publication Data

US 2004/0205435 A1    Oct. 14, 2004

(51) Int. Cl.
*G01R 31/28* (2006.01)
(52) U.S. Cl. ............... 714/734; 714/718; 714/733; 714/702; 365/201
(58) Field of Classification Search ........... 714/734, 714/724, 735, 733, 718, 25, 42, 54, 702, 714/719; 365/200, 201

See application file for complete search history.

(56) References Cited

U.S. PATENT DOCUMENTS

| 5,222,109 A | * | 6/1993 | Pricer | 377/24.1 |
| 5,633,877 A | * | 5/1997 | Shephard et al. | 714/725 |
| 6,829,181 B1 | * | 12/2004 | Seitoh | 365/201 |
| 2002/0194557 A1 | * | 12/2002 | Park | 714/718 |

* cited by examiner

*Primary Examiner*—Albert Decady
*Assistant Examiner*—Dipakkumar Gandhi
(74) *Attorney, Agent, or Firm*—Lynn L. Augspurger; Richard M. Goldman

(57) ABSTRACT

Method and system for testing a memory array having a non-uniform binary address space. The test system includes a test engine for generating addresses for the memory array and for generating and applying data patterns to the memory array. The test engine has an address generator including a series combination of a linear register and a binary counter for generating the non-uniform address.

9 Claims, 6 Drawing Sheets

Table 1
COUNTER NEXT STATE TABLE

| PRESENT STATE | | | | | NEXT STATE | | | | |
|---|---|---|---|---|---|---|---|---|---|
| C3 | C2 | C1 | C0 | C4 | C4 | C3 | C2 | C1 | C0 |
| 0 | 0 | 1 | 0 | 0 | 0 | 0 | 0 | 1 | 1 |
| 0 | 0 | 1 | 1 | 0 | 0 | 0 | 1 | 0 | 0 |
| 0 | 1 | 0 | 0 | 0 | 0 | 0 | 1 | 0 | 1 |
| 0 | 1 | 0 | 1 | 0 | 0 | 1 | 0 | 0 | 0 |
| 1 | 0 | 0 | 0 | 0 | 0 | 1 | 0 | 0 | 1 |
| 1 | 0 | 0 | 1 | 0 | 1 | 0 | 0 | 1 | 0 |
| 0 | 0 | 1 | 0 | 1 | 1 | 0 | 0 | 1 | 1 |
| 0 | 0 | 1 | 1 | 1 | 1 | 0 | 1 | 0 | 0 |
| 0 | 1 | 0 | 0 | 1 | 1 | 0 | 1 | 0 | 1 |
| 0 | 1 | 0 | 1 | 1 | 1 | 1 | 0 | 0 | 0 |
| 1 | 0 | 0 | 0 | 1 | 1 | 1 | 0 | 0 | 1 |
| 1 | 0 | 0 | 1 | 1 | 0 | 0 | 0 | 1 | 0 |

Table 2

| STATE | INPUT AD | COUNTER STATE C4 | C3 | C2 | C1 | C0 | COMPLEMENT OUT B4 | B3 | B2 | B1 | B0 | GENERATED ADDRESS A3 | A2 | A1 | A0 |
|---|---|---|---|---|---|---|---|---|---|---|---|---|---|---|---|
| 1 | 0 | 0 | 0 | 0 | 1 | 0 | 0 | 0 | 0 | 1 | 0 | 0 | 0 | 0 | 0 |
| 2 | 0 | 0 | 0 | 0 | 1 | 1 | 0 | 0 | 0 | 1 | 1 | 0 | 0 | 0 | 1 |
| 3 | 0 | 0 | 0 | 1 | 0 | 0 | 0 | 0 | 1 | 0 | 0 | 0 | 0 | 1 | 0 |
| 4 | 0 | 0 | 1 | 1 | 0 | 1 | 0 | 1 | 1 | 0 | 1 | 0 | 0 | 1 | 1 |
| 5 | 0 | 0 | 0 | 0 | 0 | 0 | 0 | 0 | 0 | 0 | 0 | 0 | 1 | 0 | 0 |
| 6 | 0 | 1 | 0 | 0 | 1 | 1 | 1 | 0 | 0 | 1 | 1 | 0 | 1 | 0 | 1 |
| 7 | 0 | 1 | 0 | 1 | 1 | 0 | 1 | 0 | 1 | 1 | 0 | 0 | 1 | 1 | 0 |
| 8 | 0 | 1 | 1 | 0 | 0 | 1 | 1 | 1 | 0 | 0 | 1 | 0 | 1 | 1 | 1 |
| 9 | 0 | 1 | 0 | 0 | 0 | 0 | 1 | 0 | 0 | 0 | 0 | 1 | 1 | 1 | 0 |
| 10 | 0 | 1 | 0 | 0 | 0 | 1 | 1 | 0 | 0 | 0 | 1 | 1 | 1 | 0 | 1 |
| 11 | 0 | 1 | 0 | 0 | 1 | 0 | 1 | 0 | 0 | 1 | 0 | 1 | 1 | 0 | 0 |
| 12 | 0 | 1 | 0 | 1 | 0 | 1 | 1 | 0 | 1 | 0 | 1 | 1 | 0 | 1 | 1 |
| 1 | 1 | 0 | 0 | 0 | 0 | 0 | 1 | 1 | 1 | 1 | 0 | 1 | 0 | 1 | 0 |
| 2 | 1 | 0 | 0 | 0 | 0 | 1 | 1 | 1 | 1 | 1 | 1 | 1 | 0 | 0 | 1 |
| 3 | 1 | 0 | 0 | 1 | 0 | 0 | 1 | 1 | 0 | 1 | 0 | 1 | 0 | 0 | 0 |
| 4 | 1 | 0 | 1 | 0 | 1 | 1 | 1 | 0 | 1 | 0 | 1 | 0 | 0 | 1 | 1 |
| 5 | 1 | 0 | 0 | 0 | 0 | 0 | 1 | 1 | 1 | 1 | 0 | 0 | 0 | 0 | 0 |
| 6 | 1 | 1 | 0 | 0 | 1 | 1 | 0 | 0 | 0 | 1 | 1 | 0 | 0 | 1 | 1 |
| 7 | 1 | 1 | 0 | 1 | 1 | 0 | 0 | 0 | 1 | 1 | 0 | 0 | 0 | 1 | 0 |
| 8 | 1 | 1 | 1 | 0 | 0 | 1 | 0 | 1 | 0 | 0 | 1 | 0 | 1 | 0 | 1 |
| 9 | 1 | 1 | 0 | 0 | 0 | 0 | 0 | 1 | 1 | 1 | 0 | 0 | 0 | 0 | 0 |
| 10 | 1 | 1 | 0 | 0 | 0 | 1 | 0 | 1 | 1 | 1 | 1 | 0 | 0 | 0 | 1 |
| 11 | 1 | 1 | 0 | 0 | 1 | 0 | 0 | 1 | 1 | 0 | 0 | 0 | 0 | 0 | 0 |
| 12 | 1 | 1 | 0 | 1 | 0 | 1 | 0 | 1 | 0 | 1 | 0 | 0 | 0 | 1 | 0 |

NON-BINARY ADDRESS GENERATION FOR ABIST

FIELD OF THE INVENTION

The invention described herein relates to Array Built In Self Testers for random access memories.

BACKGROUND

The requirement for high speed, high density and high reliability for random access memory chips, especially static random access memory (SRAM) drives efficient and effective test applications to process and manufacture viable components for subsequent incorporation in high end processor products. Manufacturing yield, and ultimately product cost are integral parts of the capability to design, manufacture, and sell computer systems in the marketplace. A key requirement to achieving leading edge technology implementations is the ability to provide for effective testing and diagnostics in the design/manufacturing process, prior to product volume ramp-up. Efficient SRAM/DRAM designs stress the manufacturing process capability. This is because of the high device usage (gates and ultimately transistor elements) in a given area (smaller memory cell yields higher number of bits per chip), and high end processor applications demand high memory bit usage. The drive for high density chips with a large number of gates per unit area results in an increased sensitivity to process defects over the accompanying logic, typically. This drives the need to analyze, understand, and eventually reduce overall process defect density to achieve product yield and cost metrics.

To this end, integrated self test, and particularly for the memory arrays, Array Built In Self Test (ABIST) has been employed to provide deterministic test coverage ensuring high quality products. Assessment of test effectiveness and diagnosis of fails to initial manufacturing test and subsequent stress screens are critical to yield diagnostics and product reliability improvement efforts, as they are more realistic indicators than monitor structures. Monitor structures are easier to diagnose, but are only models of the product/process interaction, and are expensive from the perspective of area overhead and process productivity.

Execution of the ABIST algorithms requires either explicit test programming for micro-programmable architectures, or state machine based algorithms. In ABIST that is synchronous to an external test system, an off-chip fail indicator is monitored, on a cycle-by-cycle basis, to determine at which points in the test the array fails.

In ABIST, the generation of memory/array addressing is accomplished with a single or plurality of sequential counters. These sequential counters comprise the address space of the memory under test and can be divided into appropriate sub-groups representing the row/column and or subarray dimensions of the memory array under test. Current technology provides for incrementing and decrementing the address through the address space of the memory array, and can alter the significance of the address groups i.e. Ripple row addressing as least significant, then column, or ripple column addressing as least significant, then row, to accomplish the intended test sequences. Some systems even provide for maximum address programmability to restrict the count of a wide counter implementation in order to provide self test capability for a plurality of memory array macros that have varying address sizes (width or dimension).

Traditional memory array address space is a full binary function of 'n' number of address bits decoded to $2^n$ cell locations where "n" is a whole number. With the advent of system architectures going to 10 or 12 way set associativity, instead of 8 or 16 way set associativity, or with reduced row/column counts from a traditional binary 64, 128, or 256 boundary, the memory array addressing space follows suit to give an incomplete binary address space. By an "incomplete binary address space" is meant a $2^j$ address space where "j" is not a whole number.

This process is adequate to provide n-sequential address testing of static memory array RAMs, including SRAMs utilizing clocked operations with memory cell recovery prior to subsequent operations. This is done through the use of binary counters and appropriate control logic, with provisions for division of the address application rate to the memory array device under test (dut). This allows multicycle per cell operations whereby a plurality of write or read (e.g. $R_x W_x R_x$) operations at each addressed location can be reasonably accomplished.

Alternative test methodologies to comprehensively address and test a memory array with an incomplete binary address space, as defined above, may include full binary address space generation, with some form of test result blanking during addressing of the illegal or invalid portion of the address space. Alternatively, a custom counter design may be used to perform increment/decrement function of only the allowable address space. These methodologies all have drawbacks in that either the intended test operations are interrupted with blanked or dead zones in the test methods, or added complexity and performance restrictions in counter design to accommodate the necessary carry/borrow logic to implement a non-uniform address space.

However, the capability to stress controlled address and address group transitions is important in order to test for long time constant effects and to implement low level defect screens in a cost effective and flexible manner.

OBJECTS OF THE INVENTION

It is an object of the invention to provide a consistent methodology for non-uniform binary address generation for Array Built In Self Testing.

It is a further object of the invention to provide non-uniform binary address generation while maintaining high performance with minimal logic path length, relaxed counter requirements.

It is a still further object of the invention to provide a non-uniform binary address generator to only increment, and address transition stress capability, that is, multiple-'n' address, through the use of address buss complementors to provide on-the-fly test address "jump" capability.

SUMMARY OF INVENTION

These objects are obtained through a built-in, on-chip test system for testing a memory array having a non-uniform binary address space. The test system comprises in combination: a test engine for generating addresses for the memory array and for generating and applying data patterns the memory array. The test engine is characterized by having an address generator including a series combination of a linear register and a binary counter. The on-chip test system further includes a comparator for comparison of data inputted to the memory array from the test engine with data outputted from the memory array. The comparator includes failing address functionality for retaining failing addresses.

The binary counter may actually include a plurality of binary counters. The linear register may precede the binary counter, in which case the binary counter generates the most significant address bits. Alternatively, the binary counter may precede the linear register, in which case the binary counter generates the least significant address bits.

The linear register is composed of a prime number of bits.

The test engine may include a vector field to hold an array address constant in order to apply multiple write and/or read array signals for stressing said address.

According to our invention there is also provided a method for testing a memory array having a non-uniform binary address space. The test method comprises generating addresses for the memory array and generating and applying data patterns for the memory array in a test engine, said test engine having an address generator including a series combination of a linear register and a binary counter. The next step is comparing data inputted to said memory array from said test engine with data outputted from said memory array.

In one embodiment, the method includes retaining failing addresses in the comparator.

This invention described herein provides an improved method and apparatus of non-uniform binary address generation providing programmable real time multi-n address function with a consistent and minimal hardware implementation.

This function provides the capability to stress address transitions in a plurality of modes for the purpose of characterizing long time constant and history effects and screening of both memory cell effects, and those effects that may exist in SRAM/DRAM support circuitry such as bit drivers, sense amplifiers and the like. Therefore, either alone or combined with current state of the art ABIST techniques, this invention provides advanced in-situ real time ABIST deterministic test address generation capability for flexible test development post hardware build.

The invention apparatus described herein combines a linear shift register counter function in combination with binary counters to achieve a non-uniform binary address space for purposes of memory array built in self test. As is well know in the art a complete binary address space (2, 4, 8, 16 . . . ) is easily generated using binary counter implementations. The invention described herein provides non uniform binary address spaces (e.g. 5, 6, 10, 12, 20, . . . ). These binary non-uniform addresses may be decomposed to a prime number and binary multiple.

The method and apparatus of the invention use a linear register composed of the "prime number" number of bits, and a binary counter to form the necessary multiple. The linear register is initialized for use by loading a single '1' into the least significant register position, and when the register is enabled to count, the single '1' is shifted into each register position of the linear register.

The preferred embodiment implements this as an increment only counter, followed by a complementor to provide decrement address test generation, to provide for the ability to "jump" to complement address, and return by reducing the frequency of the counter, and providing an address complement control signal. This preferred embodiment allows significant address generation capability with minimal logic implementation, semiconductor area, and very high performance.

Moreover, the method and system of our invention removes the restriction of traditional n-sequence deterministic test operations at individual memory array cell locations proceeding along the address dimension a minimum of 'n' or a multiple of 'n' test cycles before the target cell of an operation can be revisited to determine if it has been affected by preceding operations. In the invention described herein, memory array cell locations can be construed to be the target cell, and cell operations can be performed at this cell, followed by selectable operations on adjacent, or orthogonal, or opposing locations. Also, if desired, the target cell can be immediately revisited to assess impacts, before advancing to the next addressable location to establish it as the new target cell.

The method and apparatus of this invention provides an extremely cost effective solution to the problem of AC (high speed) memory array programmable test generation for long time constant/history effect mechanisms. Given that large on-chip memory macros are the primary semiconductor device yield drivers, they currently employ built in self test and some form of redundancy support for overall yield enhancement.

The method and apparatus of the invention provides for flexible, high speed address generation and programmable test capability in the incomplete binary address situation, without the requirement of fixed, predetermined test operations built into semiconductor devices. This extends the capability of state machine and micro-programmable ABIST (built in self test) functionality to include additional address stress test capability that is definable post hardware build, and usable at all subsequent levels of test of the semiconductor device, in both manufacturing and in-situ systems test if applicable.

Alternative methodologies to achieve the same function would require possibly two custom counter implementations with carry/borrow logic and two way multiplexers to deliver the address generated to the device under test, yielding increased area, and reduced performance due to higher logic path lengths.

THE FIGURES AND TABLES

Various embodiments and exemplifications of the method and apparatus of the invention are illustrated in the Figures and Tables attached hereto.

Table 1 illustrates the twelve states of the combined binary and linear shift counter, and the next state table for count function bits labeled C0 through C4.

Table 2 illustrates the complement function of the increment only counter address buss.

DETAILED DESCRIPTION OF THE INVENTION

The method and system described herein uses and builds upon an ABIST engine, as is well known in the art. The first level of description of the preferred embodiment of the herein proposed method and apparatus are block level diagrams showing the major components of an overall ABIST system.

Figure 1:
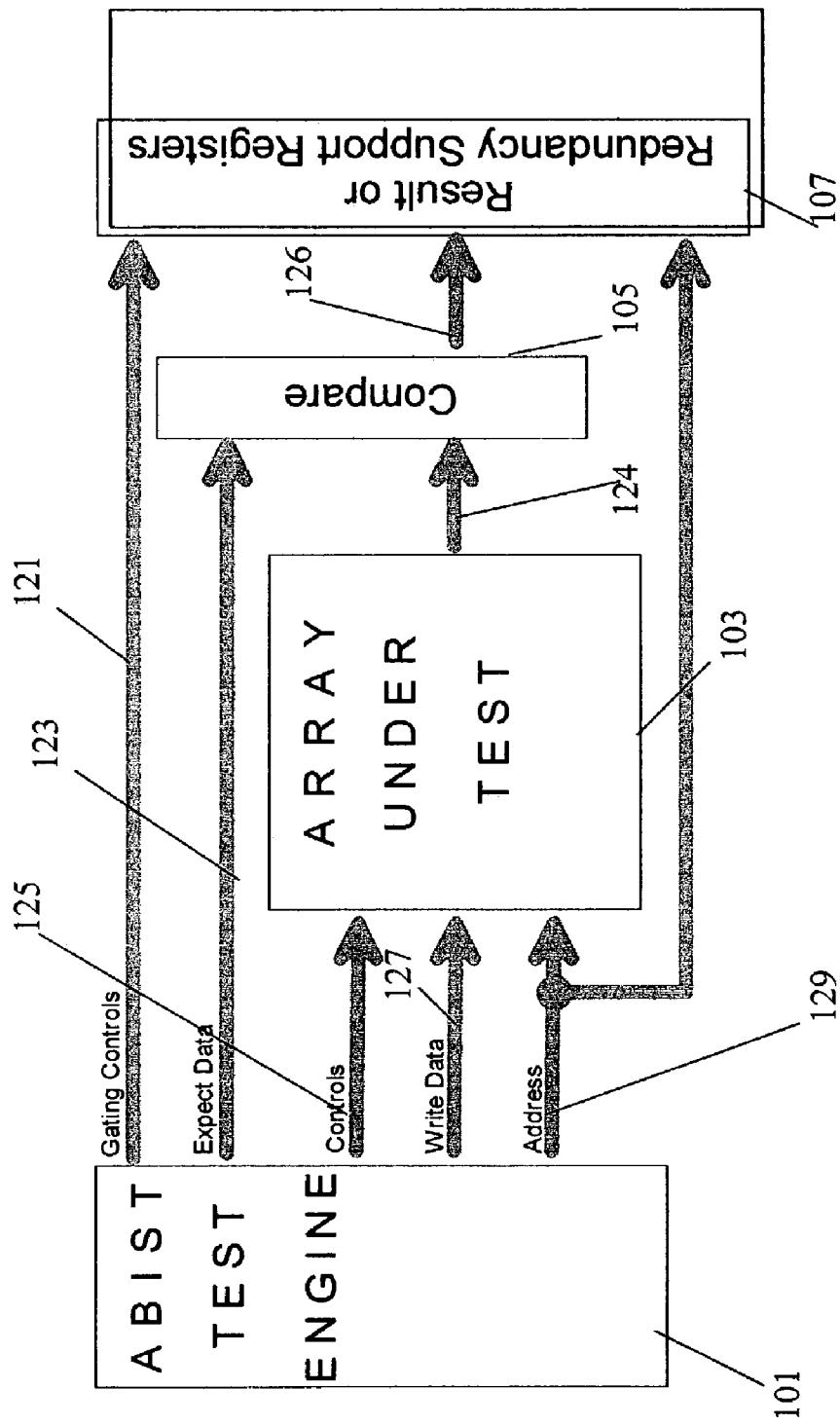
FIG. 1 illustrates an ABIST with array system support elements.

FIG. 1 shows a generalization of an ABIST 101 with array system support elements and their configuration. The redundancy allocation support referenced herein may be, but is not restricted to, two dimensional row and column addressing through address line 129 within the structure of the memory array 103 under test. There may exist a plurality of redundant row and column elements thus supported by the Redundancy Support Registers. The self test engine 101 provides the deterministic array test patterns through write data lines 127. The compare function 105 has as its inputs, the expected data vector 123 and the memory array outputs 124. It provides an overall pass/fail result signal 126 which is used in combination with the gating controls 121 from the self test engine 101 to control the redundancy support registers in establishing real time redundancy allocation.

Figure 2:
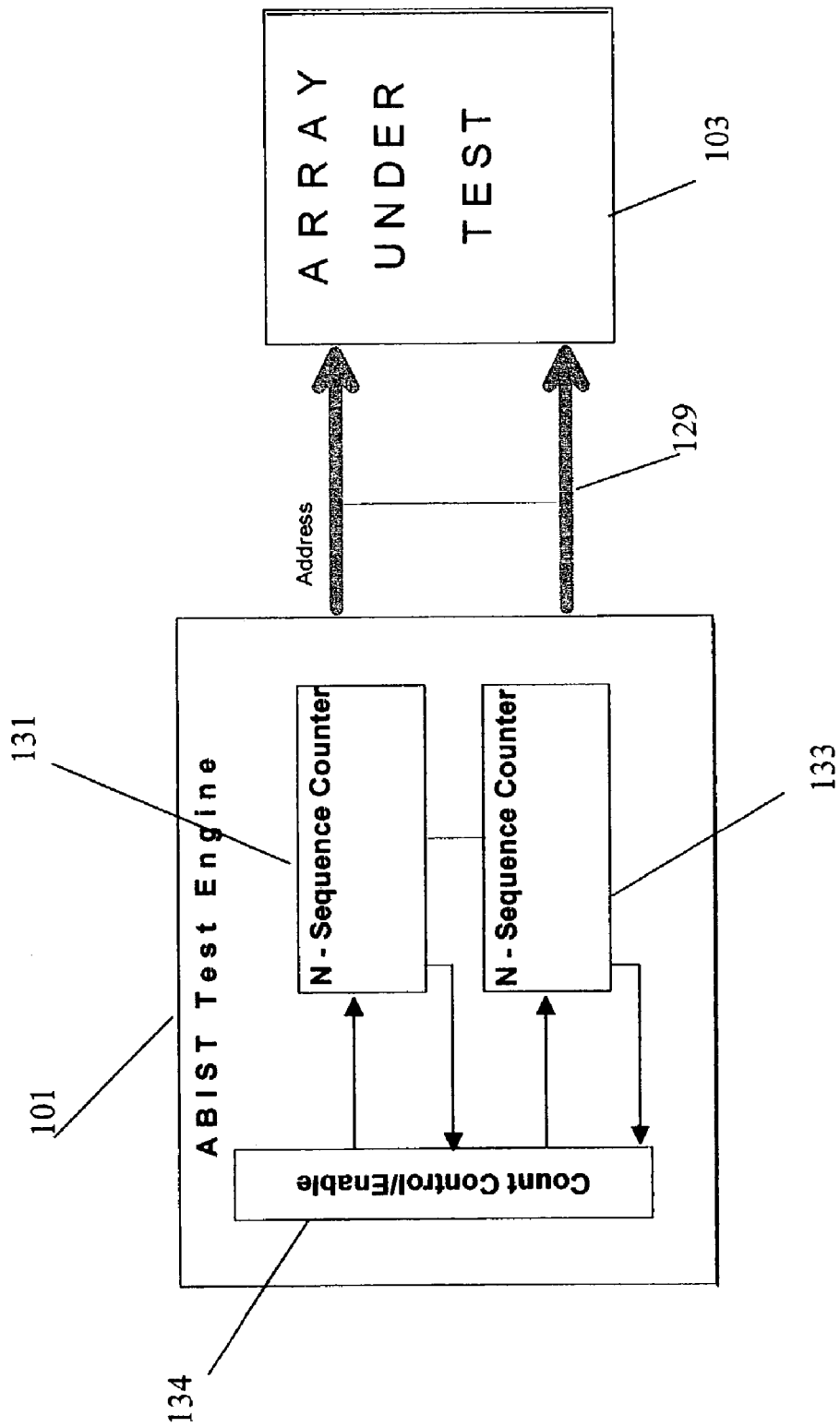
FIG. 2 illustrates support elements for a two dimensional memory array address generator.

FIG. 2 shows an exemplification of the support elements for support of two dimensional memory array address generation. There may exist a plurality of row and what will be referred to as column elements addressable within the memory array 103 structure, and possibly additional dimensions of addressing possible for sub-array or a plurality of larger memory element groupings.

In the ABIST art, one of the addressable element dimensions corresponds to the array rows in whole or in part. The other addressable element refers to the array columns in whole or in part. The N-Sequence counters, 131, 133, must perform a dual function of counting up for increment address testing, and counting down for decrement address test generation and are served by a controller 134 that establishes which counter 131, 133 is least significant, thereby establishing a plurality of array addressing modes, such as ripple word, or ripple bit (column). The controller 134 also establishes the rate at which the counters 131, 133 sequence, thereby providing for multi-cycle per cell test capability in conjunction with the other internal ABIST engine controllers providing data and R/W operation control.

Figure 4:
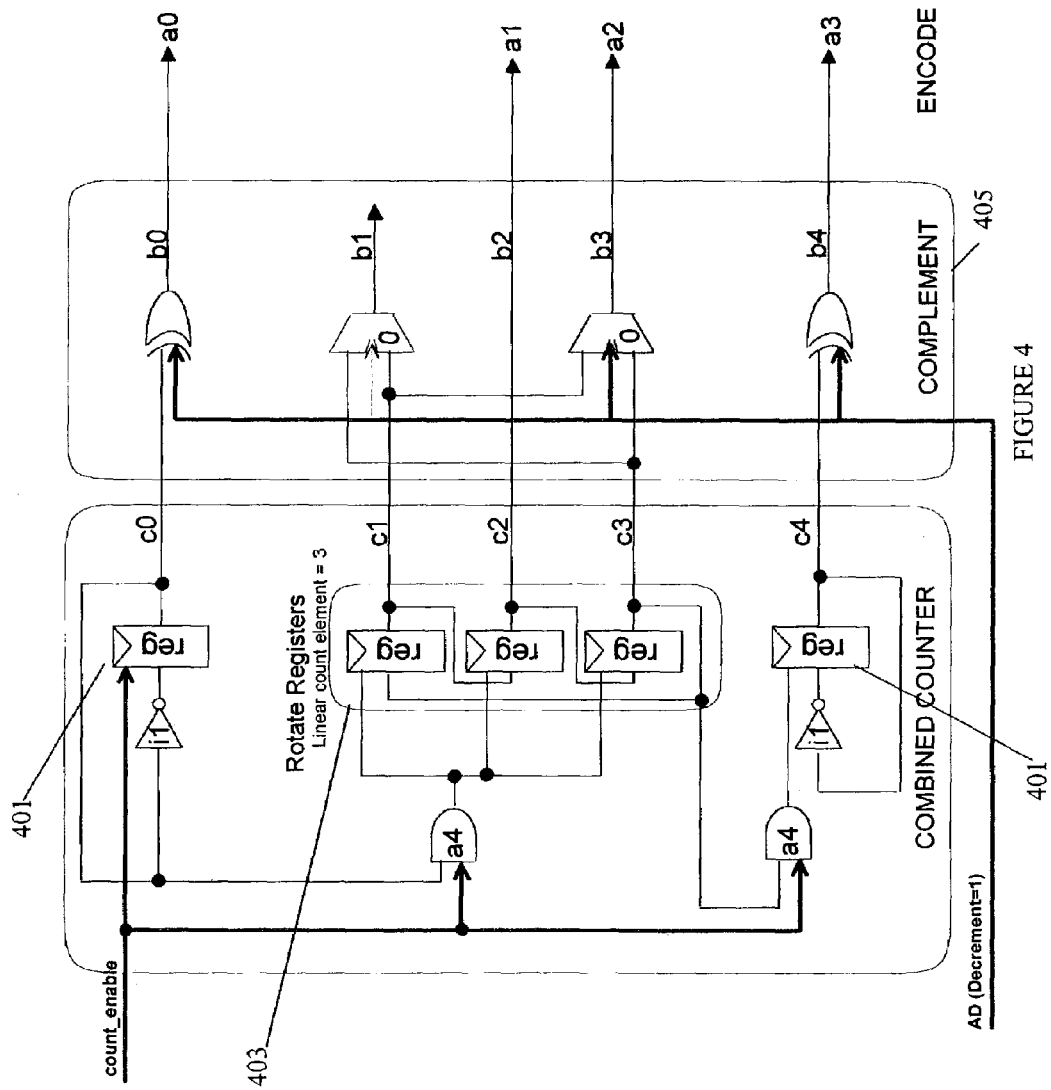
FIG. 4 illustrates an ABIST engine with a twelve state counter.

The preferred embodiment described herein, relaxes the requirement of the n-sequence counters to also count down to provide decrement addressing function of the ABIST engine by simply establishing a bank of "XOR" logic gates 141, shown in FIG. 4, in the output address buss, that when controlled will "complement" the address buss to provide the decrement address function. This is not an absolute requirement of the embodiment, but an opportunity for address generator simplification, and provides efficiency in hardware utilization.

Figure 3:
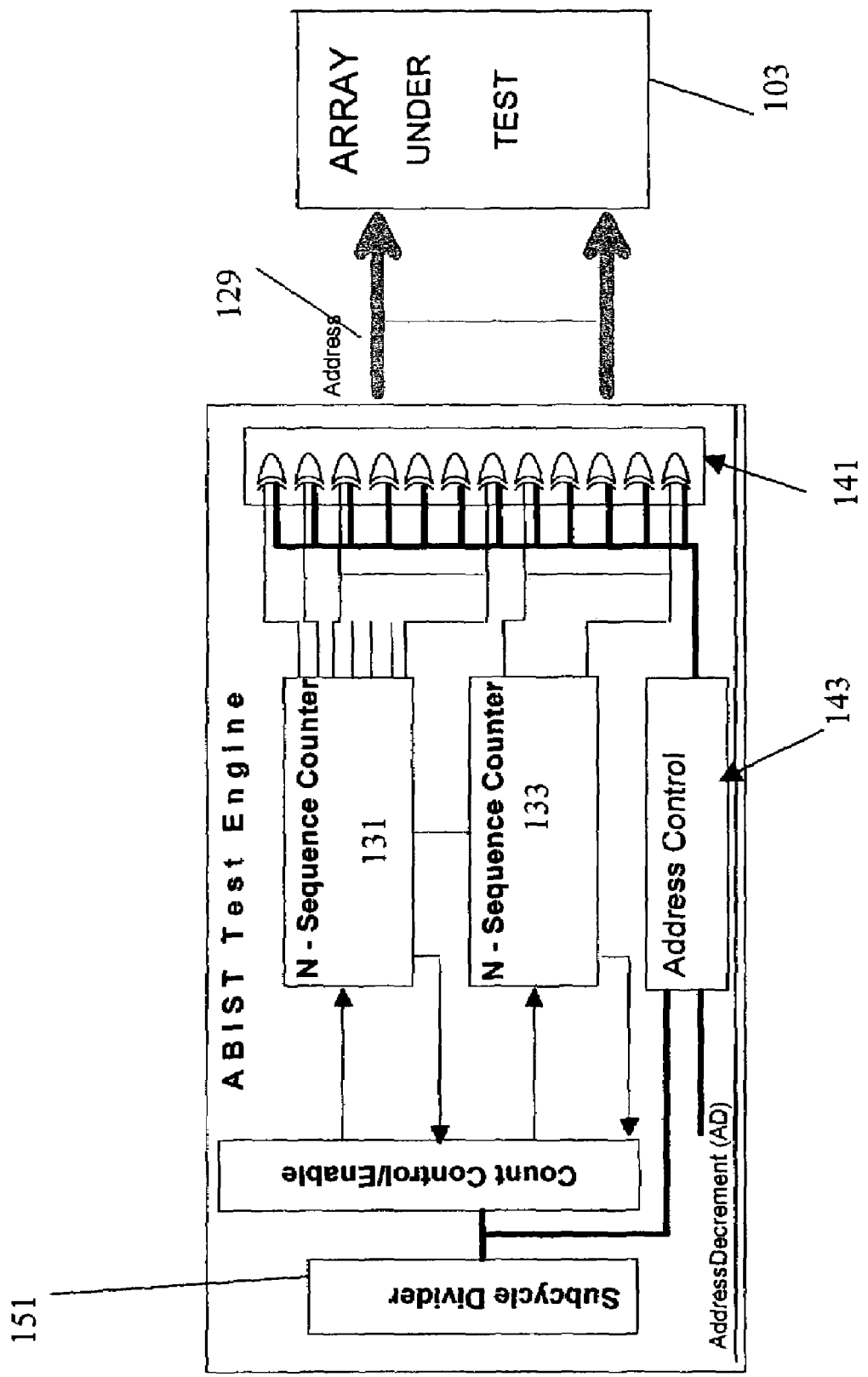
FIG. 3 illustrates an ABIST tester test engine with an address complementor.

FIG. 3 illustrates the address complementor that is used to relax the requirement of the N-Sequence counters to only increment, instead of requiring both increment and decrement function. Note shall be made that in typical support of address generation, a test engine state bit or program word bit referring to address count direction would be present and usable. In addition, a subcycle counter/divider 151 that would be used to divide the frequency of the address generator for multicycle per cell address tests, would be present, and expanded in this preferred embodiment, but not restricted to the limit of its expansion. For the purposes of this preferred embodiment, each memory addressing bit is wired through one input of an XOR logic gate 141. The second input is fed by control signals 143 providing granular control over the address buss fed to the array device 103 under test. While performing standard n-sequential address tests, these control signals are static providing the address generator mode of increment if '0' or decrement if '1'.

Through programmable elements in the address control block 143, the output address buss 129 to the array 103 under test can be transparent, that is equivalent to the N-Sequence counter outputs providing increment address function to the array under test 103. Or, the output address buss can be made a static complement of the N-sequence counter outputs, providing a decrement address sequence to the array under test.

FIG. 4 shows a preferred embodiment implementation for a 12 state counter. This invention is not restricted in any way to this number of bits, or specific configuration among linear and binary counter registers. What is shown is an effective 2×3×2 state counter. Any desired state combination can be achieved by reordering the placement of the linear prime number register counter with the necessary number of binary counters. For example, placing the 2 binary bit counters ahead (as least significant counter bits) of the 3 bit linear counter will result in an effective 4×3 state counter, and similarly placing both binary bits behind (as most significant bits) the 3 bit linear counter will result in an effective 3×4 state counter. Assembling the linear and binary counter combinations to match the memory array input decode requirements eliminates the need for any state translation logic and establishes a minimum logic configuration for the test circuits.

The method and detail of the address apparatus shown in FIG. 4 will now be described. The apparatus is composed of three primary elements: binary counter registers 401, a linear count rotate register 403, and an address buss complementor 405. Table 1 illustrates the twelve states of the combined binary and linear shift counter, and the next state table for the count function bits labeled C0 through C4.

The complement function of the increment only counter address buss shown in Table 2. This, as described earlier, uses the assumed present and usable address decrement control signal input AD. When AD is active low, 0, the address buss feeding the array under test is equal to the N-Sequence counter outputs directly (increment address mode). When address decrement input AD is '1', the address buss feeding the array under test is equal to the complement of the N-Sequence counter outputs, or decrement address mode. For the binary counter elements this is a straightforward XOR logic function. For the linear rotate register counter element bits, this is a buss transposition of the bits using 2:1 multiplexer logic. This is a key element of the invention whereby, for the purposes of address generation, the simple buss transposition of lsb to msb and lsb+1 to msb−1 accomplishes an effective linear register complement, such that once the encode is complete, the 12 state counter function complement is not a binary complement of any one state which may include invalid or illegal states, but only the valid and corresponding values of the twelve states themselves. The table entries demonstrate this concept where the complement of the '0' value state 1 is the corresponding value of the last allowable state, state 12.

While the invention has been described with respect to certain preferred embodiments and exemplifications, it is not intended to limit the scope of the invention thereby, but solely by the claims appended hereto.

We claim:

1. A built-in, on-chip test system for testing a memory array having a non-uniform binary address space decomposable to a prime number and a binary multiplier, said test system comprising in combination:

a test engine for generating addresses for said memory array and for generating and applying data patterns to said memory array, said test engine having an address generator including a series combination of a linear register having a prime number of bits and a binary counter, each generating address bits, and a complementer;

a vector field to hold an array address constant in order to apply multiple write and/or read array signals for stressing said address; and a comparator for comparison of data inputted to said memory array from said test engine with data outputted from said memory array.

2. A built-in, on-chip, test system according to claim 1, wherein said comparator includes failing address functionality for retaining failing addresses.

3. A built-in, on chip test system according to claim 1, comprising a plurality of binary counters.

4. A built-in, on-chip, test system according to claim 1, wherein said linear register precedes said binary counter and said binary counter generates the most significant address bits.

5. A built-in, on-chip, test system according to claim 1, wherein said binary counter precedes said linear register and said binary counter generates the least significant address bits.

6. A method for testing a memory array having a non-uniform binary address space decomposable to a prime number and a binary multiplier, said test method comprising:

generating addresses for said memory array and generating and applying data patterns for said memory array in a test engine, said test engine having an address generator including a series combination of a linear register having a prime number of bits and a binary counter; each generating address bits, and a complementer;

comparing data inputted to said memory array from said test engine with data outputted from said memory array; and holding an array address constant in order to apply multiple write and/or read sianals for stressing said address.

7. A method for testing a memory array according to claim 6, comprising retaining failing addresses in a comparator.

8. A method for testing a memory array according to claim 6, wherein said linear register precedes said binary counter, and said binary counter generates the most significant address bits.

9. A method for testing a memory array according to claim 6, wherein said binary counter precedes said linear register, and said binary counter generates the least significant address bits.

* * * * *